United States Patent [19]

Yu

[11] Patent Number: 5,742,085

[45] Date of Patent: Apr. 21, 1998

[54] LOW-VOLTAGE TRIGGER ELECTROSTATIC DISCHARGE PROTECTION CIRCUIT

[75] Inventor: Ta-Lee Yu, Hsien, Taiwan

[73] Assignee: Winbond Electronics Corporation, Hsinchu, Taiwan

[21] Appl. No.: 756,173

[22] Filed: Nov. 25, 1996

[30] Foreign Application Priority Data

Jul. 19, 1996 [TW] Taiwan ................................. 85108799

[51] Int. Cl.[6] .................................................. H01L 23/62
[52] U.S. Cl. ........................... 257/360; 257/356; 257/146; 257/162; 257/173; 257/124
[58] Field of Search ........................... 257/360, 356, 257/146, 162, 173, 124

[56] References Cited

U.S. PATENT DOCUMENTS

| | | | |
|---|---|---|---|
| 4,400,711 | 8/1983 | Avery | 257/360 |
| 5,077,591 | 12/1991 | Chen et al. | 257/146 |
| 5,576,557 | 11/1996 | Ker et al. | 257/146 |
| 5,682,047 | 10/1997 | Consiglio et al. | 257/360 |

*Primary Examiner*—Jerome Jackson
*Attorney, Agent, or Firm*—Fish & Richardson P.C.

[57] ABSTRACT

A low-voltage trigger electrostatic discharge protection circuit with different layout structure, smaller chip area for better performance and space saving is connected, to the bonding pad of an IC to protect an internal circuit of an IC from electrostatic discharge damage using at least one NMOS transistor and at least two SCR connected in parallel between the bonding pad and a circuit ground point. When the electrostatic discharge stress is applied to the bonding pad, the NMOS will breakdown before breakdown of the gate oxide layer of the internal circuit to trigger the SCRs into snapback mode operation. Then the electrostatic discharge stress on the bonding pad is released by two SCRs (or more). Because the electrostatic discharge stress can be released by two SCRs at the same time, the invention can protect the SCRs from damage as well rather than the prior art using just one SCR and lead to better ESD performance. Furthermore, the chip area of the invention is about 150 μm² smaller than that of prior art for space saving. For more precise statement, the invention provides about 10% chip area saving.

4 Claims, 4 Drawing Sheets

LOW-VOLTAGE TRIGGER ELECTROSTATIC DISCHARGE PROTECTION CIRCUIT

BACKGROUND OF THE INVENTION

1. Field of the Invention

The invention relates to a protection circuit of preventing electrostatic discharge damage in integrated circuits (IC), and particularly to a low-voltage trigger electrostatic discharge protection circuit with different layout structure, smaller chip area for better performance and space saving.

2. Description of Related Art

Electrostatic discharge (shortened to ESD in the following) exists in the measurement, assembly, installation and other uses of integrated circuits. ESD can cause IC damage and indirectly affect the function of electronic systems having ICs. There are three general models for explaining the causes of the ESD: (1) the human body model defined by MIL-STD-883, Method 3015.6 which describes the ESD stress produced when a human with electrostatic charge touches a connection pin(s) of the IC; (2) the machine model, a measurement method defined by present industrial standard EIAJ-IC-121, method 20, which describes the ESD stress created when a machine with electrostatic charge touches the connection pin(s) of the IC; and (3) the charge device model which describes integrated circuits with electrostatic charge contacting a grounded conductor and subsequently creating a pulse path in the IC.

Referring to FIG. 1, a top view of the layout of a conventional low-voltage trigger electrostatic discharge protection circuit manufactured in a p-type silicon substrate 1. An n-type well region 10 is formed in the p-type silicon substrate 1. An n-type diffusion region 101 and a p-type diffusion region 102 are separately formed in the n-type well region 10. Two n-type diffusion regions, 12 and 14, are formed in the p-type silicon substrate 1, but the n-type diffusion region 14 partly overlaps the n-type well region 10. The gate structure 15 is formed between the n-type diffusion regions 12 and 14. And the layout of the conventional low-voltage trigger electrostatic discharge circuit mentioned above constructs one SCR and one NMOS. Moreover, the detailed dimensions are also shown in FIG. 1. The labels a, b, c, d1, d2, e1, e2, f, g, h, i, j1, j2, k represent about 62 µm, 25 µm, 60 µm, 1 µm, 1 µm, 3 µm, 3 µm, 2 µm, 2 µm, 4 µm, 1 µm, 3 µm, 3 µm, and 2 µm, respectively and the total chip area is about 1550 µm² (62 µm×25 µm).

As the dimensions of IC devices continue to shrink, the low-voltage trigger electrostatic discharge protection circuit with different layout structure and smaller chip area for better performance and space saving is needed.

SUMMARY OF THE INVENTION

The object of the invention is to provide a low-voltage trigger electrostatic discharge protection circuit with different layout structure, smaller chip area for better performance and space saving.

The low-voltage trigger electrostatic discharge protection circuit disposed on a bonding pad of an IC to protect an internal circuit of the IC from electrostatic discharge damage includes a p-type silicon substrate; two n-type well regions separated from each other and formed in the p-type silicon substrate; two first n-type diffusion regions each of which is formed in a different one of the n-type well regions; two first p-type diffusion regions each of which is formed in a different one of the n-type well regions; a second n-type diffusion region formed in the p-type silicon substrate and extending from between the n-type well regions to one side of the n-type well regions; a third n-type diffusion region spaced from the second n-type diffusion region and formed in the p-type silicon substrate; a gate structure formed on the p-type silicon substrate between the second n-type diffusion region and the third n-type diffusion region and extending from the second n-type diffusion region to the third n-type diffusion region; and a second p-type diffusion region formed in the p-type silicon substrate. And the equivalent circuit of the invention is made up of at least two silicon controller rectifiers (SCRs) having anodes and cathodes coupled to the bonding pad and a circuit ground point respectively; and an NMOS transistor having a drain coupled to the bonding pad and a gate and a source electrically coupled to the circuit ground point.

BRIEF DESCRIPTION OF THE DRAWINGS

The objectives, aspects, and advantages of the invention mentioned above are more easily understood with reference to the description of the preferred embodiment discussed below and the following drawings.

DETAILED DESCRIPTION OF THE INVENTION

Figure 1:
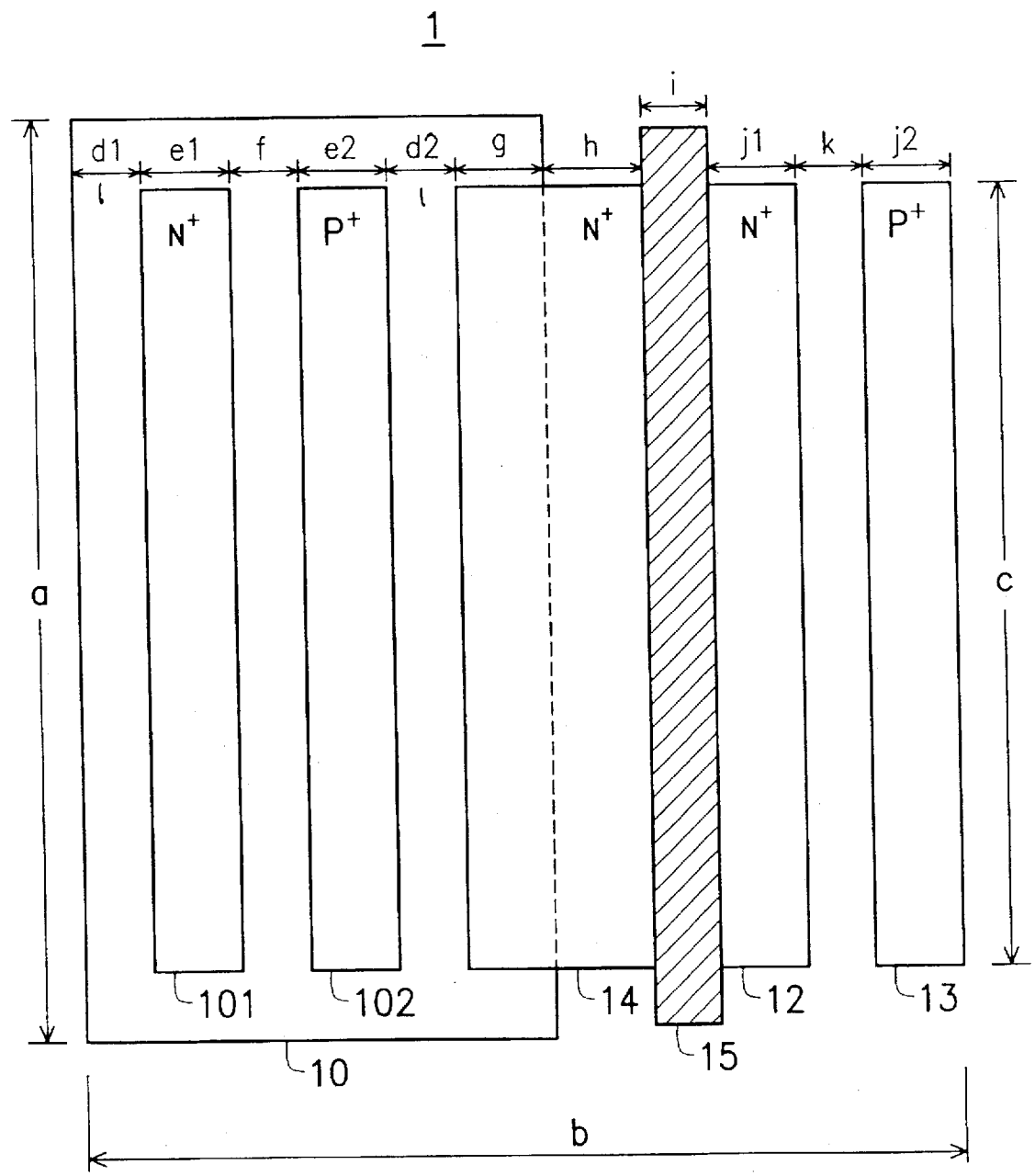
FIG. 1 is a top view of the layout of a conventional low-voltage trigger electrostatic discharge protection circuit.
Figure 2:
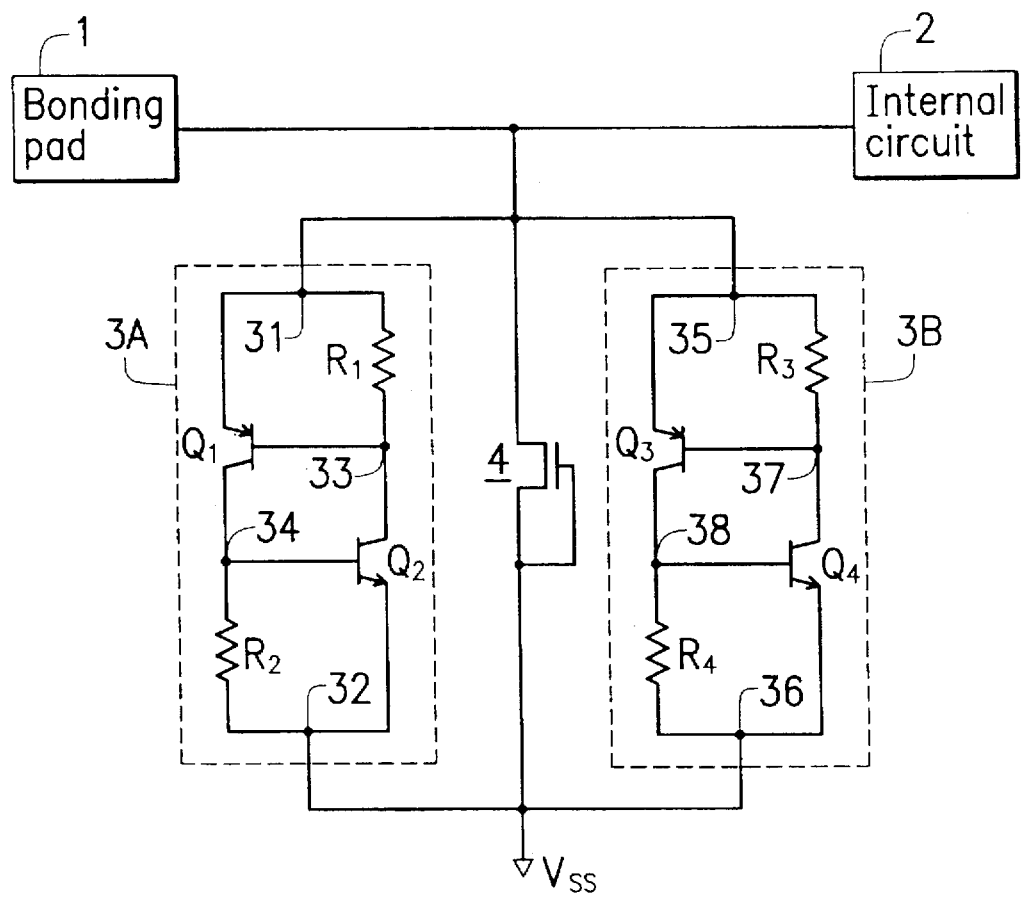
FIG. 2 is a schematic view showing the circuit of preferred embodiment according to the invention.

Referring to FIG. 2, a schematic view of a circuit of the preferred embodiment according to the invention is shown. A low-voltage trigger electrostatic discharge protection circuit of the invention connected to a bonding pad 1 of an IC for protecting the internal circuit 2 of the IC from electrostatic discharge stress damage.

As shown in FIG. 2, the low-voltage trigger electrostatic discharge protection circuit includes a pair of silicon controlled rectifiers (hereafter referred to as an SCR) 3A, 3B and an NMOS field effect transistor 4. Although the circuit in FIG. 2 is shown having two SCRs, 3A and 3B, more than two SCRs is within the scope of the invention.

An anode 31 and cathode 32 of the SCR 3A are connected to the bonding pad 1 and a circuit ground point $V_{ss}$, respectively. Similarly, an anode 35 and cathode 36 of SCR 3B are connected to the bonding pad 1 and the circuit ground point $V_{ss}$, respectively. The drain of the NMOS transistor 4 is connected to the bonding pad 1 and its electrically-coupled gate and source of the NMOS transistor 4 are connected to the circuit ground point $V_{ss}$.

SCR 3A also includes a PNP bipolar junction transistor $Q_1$, an NPN bipolar junction transistor $Q_2$ and two current limiting resistors $R_1$ and $R_2$. The emitter of the PNP transistor $Q_1$ serves as the anode 31 of the SCR 3A; the base of the PNP transistor $Q_1$ and the collector of the NPN transistor $Q_2$ are connected to each other to form an anode gate 33; the collector of the PNP transistor $Q_1$ and the base of the NPN transistor $Q_2$ are connected to each other to form a cathode gate 34; and the emitter of the NPN transistor $Q_2$ serves as the cathode 32 of the SCR 3A. Resistor $R_1$ is connected between the anode 31 and anode gate 33 while resistor $R_2$ is connected between the cathode gate 34 and cathode 32.

Similarly, SCR 3B includes a PNP bipolar junction transistor $Q_3$, an NPN bipolar junction transistor $Q_4$, and two current limiting resistors $R_3$ and $R_4$. As was the case with SCR 3A, the emitter of PNP transistor $Q_3$ serves as the anode 35 of the SCR 3B; the base of the PNP transistor $Q_3$ and the collector of the NPN transistor $Q_4$ are connected to each other to form a anode gate 37; the collector of the PNP transistor $Q_3$ and the base of the NPN transistor $Q_4$ are connected to each other to form a cathode gate 38; and the emitter of the NPN transistor Q4 serves as the cathode 36 of the SCR 3B. Resistor R3 is connected between the anode 35 and anode gate 37 while resistor R4 is connected between the cathode 36 and cathode gate 38.

Figure 3:
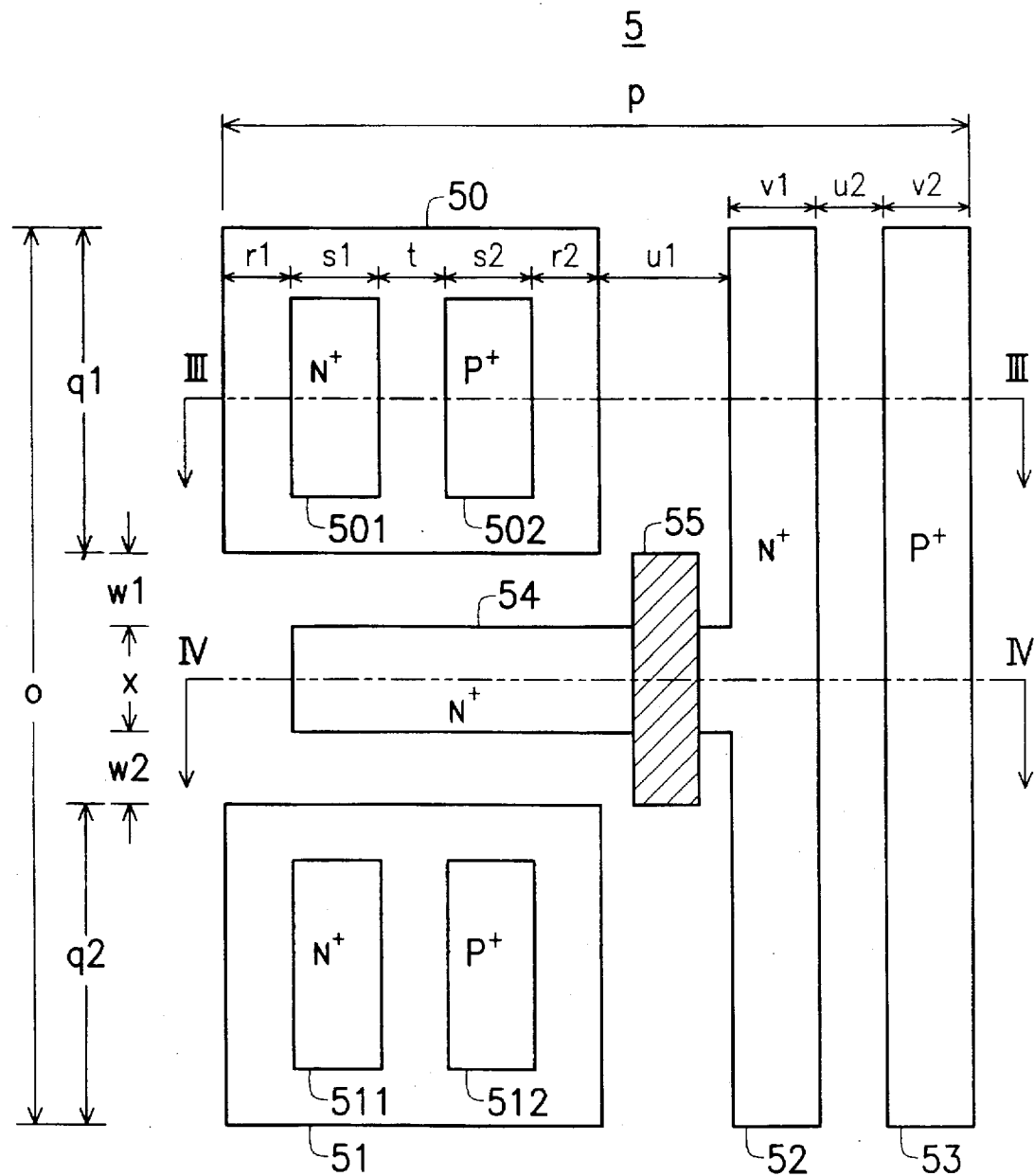
FIG. 3 is a top view of the circuit layout in FIG. 2 manufactured in a P-type silicon substrate.

Referring to FIG. 3, a top view of the circuit layout of in FIG. 2 manufactured in a p-type silicon substrate 5 is shown. Two n-type well regions, 50, 51, are formed separately from each other in the p-type silicon substrate 5. An n-type diffusion region 52 and a p-type diffusion region 53 which are separated from each other are formed in the p-type silicon substrate 5. P-type diffusion region 53 is formed to facilitate contact to the p-type silicon substrate 5. An n-type diffusion region 54 is also formed in the p-type silicon substrate 5 between well regions 50 and 51 and spaced from n-type diffusion region 52. Gate structure 55, includes a gate dielectric layer and a gate electrode layer formed from top to bottom over silicon substrate 5 and between the n-type diffusion regions 52 and 54. Gate structure 55 has two ends which partly overlap the n-type diffusion regions 52 and 54. An n-type diffusion region 501 and a p-type diffusion region 502 are formed in the n-type well region 50 while an n-type diffusion region 511 and a p-type diffusion region 512 are formed in the n-type well region 51. N-type diffusion regions 501, 511 facilitate contact to n-type well regions, 50, 51, respectively. The detailed dimensions of the circuit layout of the embodiment are also shown in FIG. 3. The labels o, p, q1, q2, r1, r2, s1, s2, t, u1, u2, v1, v2, w1, w2, x represent about 70 µm, 20 µm, 32 µm, 32 µm, 1 µm, 1 µm, 3 µm, 3 µm, 2 µm, 2 µm, 2 µm, 3 µm, 3 µm, 0.5 µm, 0.5 µm, and 5 µm, respectively and the total chip area of the circuit layout of the embodiment is about 1400 µm² (70 µm×20 µm). Besides, the cross-sectional views along lines III—III and IV—IV are shown in FIG. 4 and FIG. 5.

Figure 4:
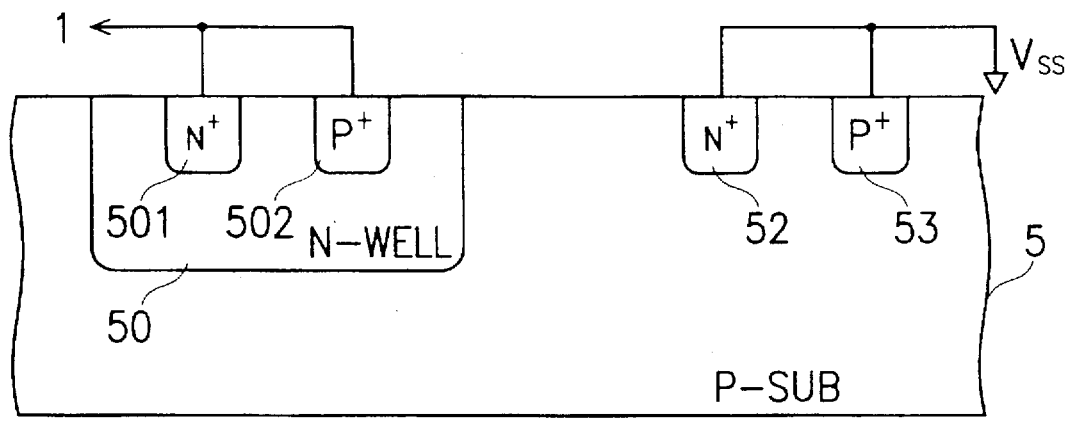
FIG. 4 is a cross-sectional side view along line III—III of FIG. 3.

Referring to FIG. 4, p-type diffusion region 502, n-type well region 50 and p-type silicon substrate 5 form the emitter, base and collector of the PNP bipolar junction transistor Q1 respectively; while n-type well region 50, p-type silicon substrate 5 and n-type diffusion region 52 form the collector, base and emitter of the NPN bipolar junction transistor Q2, respectively. SCR 3A is formed by coupling the base of transistor Q1 and collector of Q2 and coupling the collector of transistor Q1 and the base of the transistor Q2. The emitters of transistor Q1 and Q2 are connected to bonding pad 1 and $V_{ss}$, respectively, and the n-type diffusion region 501 and p-type diffusion region 502 are electrically coupled to each other. In addition, n-type diffusion region 52 and p-type diffusion region 53 are electrically coupled to each other. Current limiting resistors R1 and R2 of SCR 3A are provided by the spreading resistance of n-type well region 50 and p-type silicon substrate 5, respectively.

Similarly, p-type diffusion region 512, n-type well region 51 and a p-type silicon substrate 5 form the emitter, base and collector of the PNP bipolar junction transistor $Q_3$; while n-type well region 51, p-type silicon substrate 5 and n-type diffusion region 52 form the collector, base, and emitter of the NPN bipolar junction transistor $Q_4$. SCR 3B is formed by coupling the base of transistor $Q_3$ and the collector of the transistor $Q_4$ and coupling the collector of the transistor $Q_3$ and the base of the transistor $Q_4$. The emitters of transistor $Q_3$ and $Q_4$ are connected to the bonding pad 1 and $V_{ss}$, respectively. In addition, n-type diffusion region 511 and p-type diffusion region 512 are electrically coupled to each other. Current limiting resistors $R_3$ and $R_4$ of SCR 3R are provided by the spreading resistance of n-type well region 51 and p-type silicon substrate 5 respectively.

Figure 5:
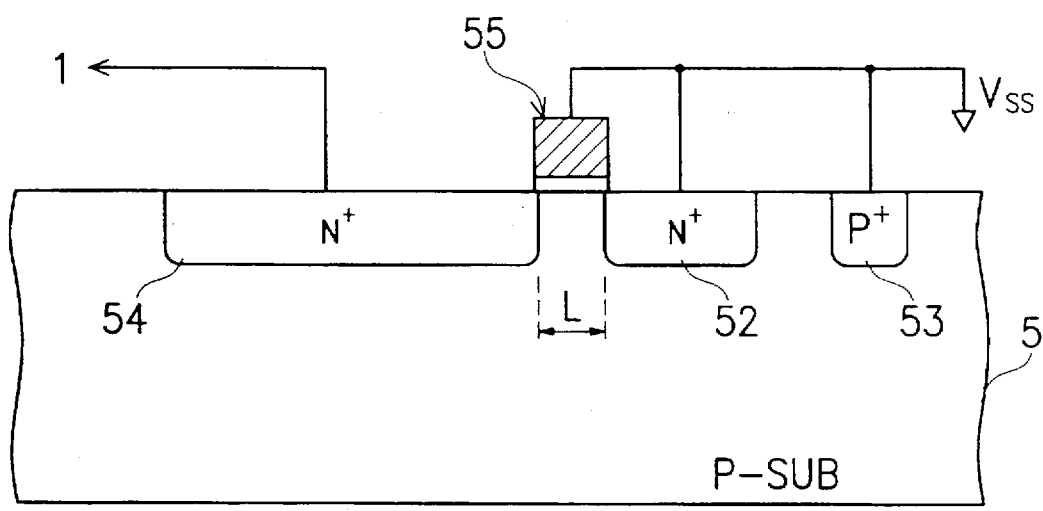
FIG. 5 is a schematic representation of a cross-sectional side view along line IV—IV of FIG. 3.

Referring to FIG. 5, the drain, gate and source of the NMOS field effect transistor 4, are formed by n-type diffusion region 54, gate structure 55 and n-type diffusion region 52, respectively. The n-type diffusion region 54 is connected to bonding pad 1 and gate structure 55 is coupled to n-type diffusion region 52.

When electrostatic discharge stress is applied to bonding pad 1, NMOS field effect transistor 4 will breakdown before breakdown of the gate oxide layer of the internal circuit. The breakdown voltage can be controlled by adjusting the distance L between the n-type diffusion regions 52 and 54 (i.e. the length of passageway of the NMOS transistor). For example, with a 0.6 micrometer CMOS process, the breakdown voltage of the NMOS transistor 4 is about 11~13 V. After the NMOS transistor 4 breaks down, a large electric current will be created to trigger the SCR 3A and 3B into the snapback mode operation. The electrostatic discharge stress of bonding pad 1 can be released to protect the connected internal circuit from electrostatic discharge damage by virtue of the SCRs 3A and 3B being in the "on" condition.

In summary, the low-voltage trigger electrostatic discharge circuit of the invention consists of an NMOS transistor and at least two SCRs. When ESD stress is applied to the bonding pad 1, the NMOS transistor will break down relatively quickly to trigger two SCRs into the snapback operation and release the ESD stress on the bonding pad 1, thereby protecting the internal circuit. Because the ESD stress is released by at least two SCRs at the same time, the SCRS can be also protected more strictly from damage rather than just using one or two SCRs. Moreover, to compare the chip area of the invention with that of prior art, the chip area of the invention is obviously about 150 µm² smaller than that of the prior art. For more precise statement, the invention provides about 10% chip area saving. Based on the discussion above, the low-voltage trigger electrostatic discharge protection circuit of the invention has different layout structure, smaller chip area for better performance and space saving.

Although the invention is disclosed by the preferred embodiment, it is not intended to limit the invention. Those knowledgeable in the art can make modifications within the scope and spirit of the invention which is determined by the claims below.

What is claimed is:

1. A low-voltage trigger electrostatic discharge protection circuit disposed on a bonding pad of an IC to protect an internal circuit of said IC from electrostatic discharge damage, comprising:

a p-type silicon substrate;

two n-type well regions separated from each other and formed in said p-type silicon substrate;

two first n-type diffusion regions each of which is formed in a different one of said n-type well regions;

two first p-type diffusion regions each of which is formed in a different one of said n-type well regions;

a second n-type diffusion region formed in said p-type silicon substrate and extending from between said n-type well regions to one side of said n-type well regions;

a third n-type diffusion region spaced from said second n-type diffusion region and formed in said p-type silicon substrate;

a gate structure formed on said p-type silicon substrate between said second n-type diffusion region and said third n-type diffusion region and extending from said second n-type diffusion region to said third n-type diffusion region; and a second p-type diffusion region formed in said p-type silicon substrate.

2. The low-voltage trigger electrostatic discharge protection circuit as claimed in claim 1 comprising:

two silicon controlled rectifiers (SCRs) having anodes and cathodes connected to said bonding pad and a circuit ground point, respectively; and an NMOS transistor having a drain coupled to said bonding pad and a gate and a source both coupled to said circuit ground point.

3. The low-voltage trigger electrostatic discharge protection circuit as claimed in claim 2 wherein each of said SCRs comprises:

a PNP transistor with an emitter as one of said anodes; and an NPN transistor with a collector coupled to a base of said PNP transistor as an anode gate, a base coupled to a collector of said PNP transistor as a cathode gate and a emitter as one of said cathodes.

4. The low-voltage trigger electrostatic discharge protection circuit as claimed in claim 2 wherein each of said SCRs further comprises:

A first resistor coupled between said anodes and said cathode gate; and

A second resistor coupled between said cathodes and said cathode gate.

\* \* \* \* \*